United States Patent
Lee et al.

(10) Patent No.: US 8,076,198 B2
(45) Date of Patent: Dec. 13, 2011

(54) METHOD OF FABRICATING NONVOLATILE MEMORY DEVICE

(75) Inventors: Hyosan Lee, Suwon-si (KR); Boun Yoon, Seoul (KR); Kuntack Lee, Suwon-si (KR); Donghyun Kim, Hwaseong-si (KR); Daehyuk Kang, Hwaseong-si (KR); Imsoo Park, Seongnam-si (KR); Youngok Kim, Suwon-si (KR); Young-Hoo Kim, Seongnam-si (KR); Sang Won Bae, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/657,092

(22) Filed: Jan. 13, 2010

(65) Prior Publication Data
US 2010/0178755 A1 Jul. 15, 2010

(30) Foreign Application Priority Data
Jan. 14, 2009 (KR) ........................ 10-2009-0003104

(51) Int. Cl.
*H01L 21/336* (2006.01)
*H01L 21/76* (2006.01)
*H01L 21/4763* (2006.01)
*H01L 21/461* (2006.01)

(52) U.S. Cl. ........ 438/257; 438/267; 438/268; 438/424; 438/446; 438/637; 257/E21.613; 257/E21.614; 257/E21.645; 257/E21.679; 257/E21.681

(58) Field of Classification Search ........... 257/E21.423, 257/E21.613, E21.663, E21.665, E21.614, 257/E21.645, E21.679, E21.681
See application file for complete search history.

(56) References Cited

U.S. PATENT DOCUMENTS

| | | | |
|---|---|---|---|
| 7,342,280 B2 * | 3/2008 | Yoo | 257/324 |
| 7,566,616 B2 | 7/2009 | Song | |
| 2005/0023599 A1 | 2/2005 | Song | |
| 2006/0154460 A1 * | 7/2006 | Yun et al. | 438/586 |
| 2008/0023749 A1 * | 1/2008 | Kim et al. | 257/316 |
| 2008/0067583 A1 * | 3/2008 | Kidoh et al. | 257/326 |
| 2009/0001419 A1 | 1/2009 | Han et al. | |
| 2009/0233432 A1 | 9/2009 | Song | |
| 2009/0280641 A1 * | 11/2009 | Kang et al. | 438/653 |
| 2010/0001336 A1 * | 1/2010 | Maruyama et al. | 257/324 |
| 2010/0038699 A1 * | 2/2010 | Katsumata et al. | 257/324 |
| 2010/0117047 A1 * | 5/2010 | Tanaka et al. | 257/3 |
| 2010/0117137 A1 * | 5/2010 | Fukuzumi et al. | 257/324 |
| 2010/0176440 A1 * | 7/2010 | Omura | 257/324 |

FOREIGN PATENT DOCUMENTS

| | | |
|---|---|---|
| JP | 4-340270 A | 11/1992 |
| KR | 10-0559995 B1 | 3/2006 |
| KR | 10-0855990 B1 | 8/2008 |

* cited by examiner

*Primary Examiner* — Mohsen Ahmadi
(74) *Attorney, Agent, or Firm* — Onello & Mello, LLP

(57) ABSTRACT

A method of fabricating a nonvolatile memory device with a three-dimensional structure includes alternately stacking first and second material layers in two or more layers on a semiconductor substrate, forming trenches penetrating the stacked first and second material layers by performing a first etching process, and removing the second material layers exposed in the trenches by performing a second etching process. The first and second material layers are formed of materials that have the same main component but have different impurity contents, respectively.

11 Claims, 11 Drawing Sheets

12# METHOD OF FABRICATING NONVOLATILE MEMORY DEVICE

CROSS-REFERENCE TO RELATED APPLICATIONS

This application claims priority under 35 U.S.C. §119 to Korean Patent Application 10-2009-0003104, filed on Jan. 14, 2009, the contents of which are herein incorporated by reference in their entirety.

BACKGROUND

1. Field

Embodiments of the inventive concept relate to a nonvolatile memory device, more particularly, to a nonvolatile memory device with a three-dimensional structure capable of improving electrical characteristics and a method of fabricating the same.

2. Description of the Related Art

In general, nonvolatile memory devices can electrically erase and program data and can retain data even if a power source is interrupted. Nonvolatile memory devices are increasingly being used in various fields.

These nonvolatile memory devices are provided with various types of memory cell transistors. The nonvolatile memory devices include flash memory devices. Flash memory devices may be classified into types, namely, NAND type and NOR type, according to cell array structures. The NAND-type flash memory devices and the NOR-type flash memory devices have both advantages and disadvantages in high integration and high-speed performance, respectively.

Specifically, NAND-type flash memory devices are advantageous for high integration due to a cell string structure in which a plurality of memory cell transistors are connected to each other in series. In addition, since the NAND-type flash memory devices utilize an operation which simultaneously changes all information stored in the plurality of memory cell transistors, an information update speed of the NAND-type flash memory devices is far faster than that of the NOR-type flash memory device. Due to the high integration and fast update speed, the NAND-type flash memory devices are mainly used for portable electronic products that require a mass storage device such as a digital camera or an MP3 player.

Research and developments have been actively made in order to promote and improve advantages of the NAND-type flash memory devices. Specifically, developments have been made with regard to NAND-type flash memory devices with three-dimensional structures.

SUMMARY

An embodiment of the inventive concept is directed to a nonvolatile memory device with a three-dimensional structure in which electrical characteristics are improved.

An embodiment of the inventive concept is also directed to a method of fabricating a nonvolatile memory device with a three-dimensional structure in which electrical characteristics and efficiency in a fabricating process are improved.

An exemplary embodiment of the inventive concept is to provide a method of fabricating a nonvolatile memory device including: alternately stacking first and second material layers in two or more layers on a semiconductor substrate; forming trenches penetrating the stacked first and second material layers by performing a first etching process; and removing the second material layers exposed in the trenches by performing a second etching process. The first and second material layers are formed of materials that have the same main component and have different impurity contents, respectively.

In one exemplary embodiment, an etch selectivity of the first and second material layers during the second etching process is greater than that of the first and second material layers during the first etching process. In another exemplary embodiment, an etch rate of the second material layer is greater than that of the first material layer during the second etching process.

In one exemplary embodiment, the first and second material layers are stacked in-situ.

In one exemplary embodiment, the first and second material layers are formed of a silicon oxide, and the impurity content of the second material layer is greater than that of the first material layer. In another exemplary embodiment, the first material layer is formed of a thermal oxide, TEOS (Tetra Ethyl Ortho Silicate), HDP (High Density Plasma), or USG (Undoped Silicate Glass), and the second material layer is formed of BPSG (BoroPhosphoSilicate Glass), BSG (BoroSilicate Glass), or PSG (PhosphoSilicate Glass). In another exemplary embodiment, the second etching process removes the second material layer by using HF gas, mixtures of hydrofluoric acid and de-ionized water, or mixtures of low-polar organic solvent, hydrofluoric acid, and de-ionized water.

In one exemplary embodiment, the first etching process is an anisotropic etching process, and the second etching process is an isotropic etching process.

In one exemplary embodiment, the forming of the trenches includes forming first and second trenches in this order, and the method further includes forming a semiconductor pattern at an inner wall of the first trench after forming the first trench. In another exemplary embodiment, the removing of the second material layers includes removing the second material layers exposed by the second trench and exposing portions of sidewalls of the semiconductor pattern, and the method further includes forming a charge storage layer and a conductive pattern on the exposed semiconductor pattern.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF PREFERRED EMBODIMENTS

Figure 1:
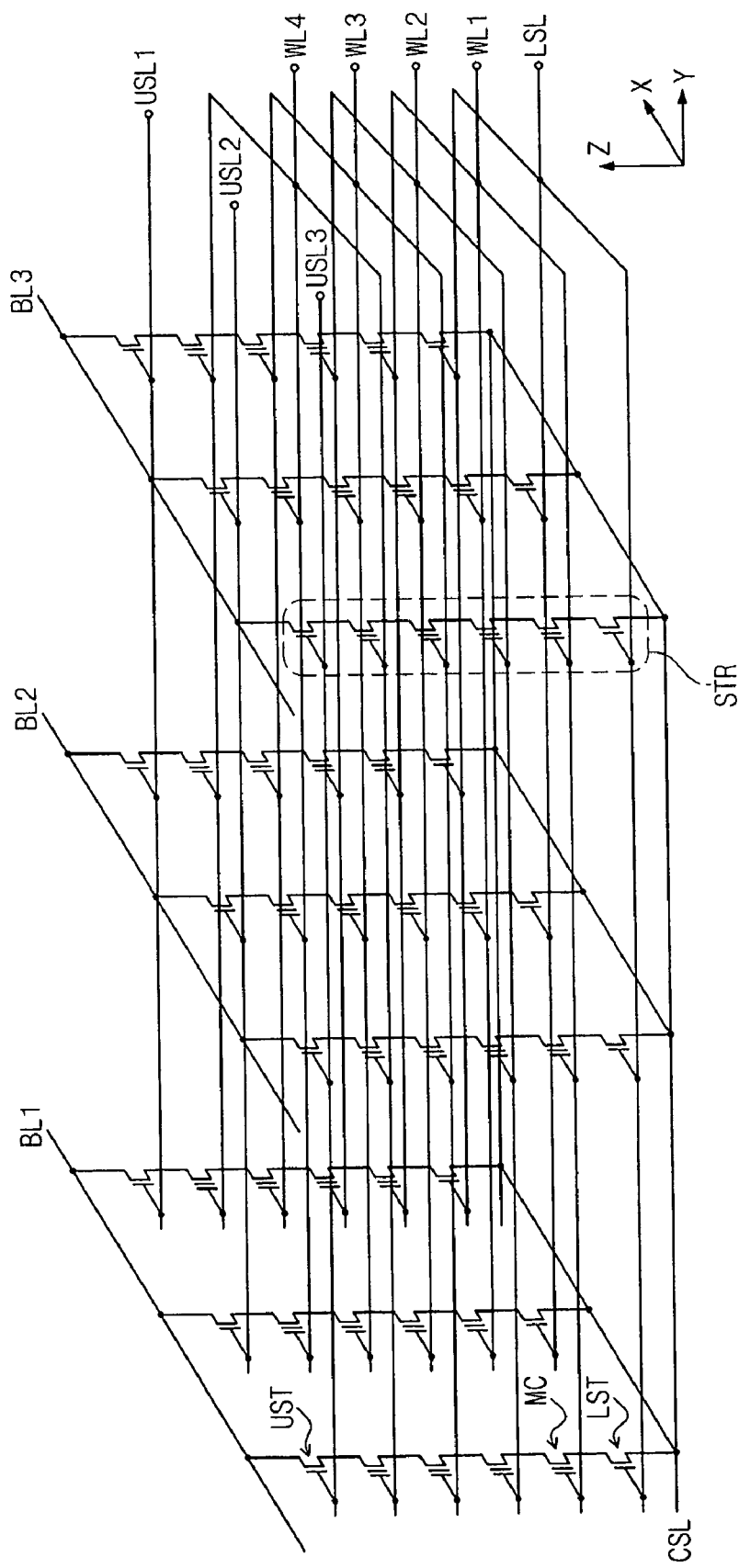
FIG. 1 is a schematic circuit diagram of a nonvolatile memory device according to an exemplary embodiment of the inventive concept.

Advantages and features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the inventive concept will only be defined by the appended claims. Like reference numerals refer to like elements throughout the specification.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, it will be understood that when a layer is referred to as being "on" another layer or a substrate, it may be directly on another layer or substrate or intervening layers may be present.

Example embodiments are described herein with reference to cross-sectional illustrations and/or plane illustrations that are schematic illustrations of idealized embodiments of example embodiments. In drawings, the thickness of layers and regions is exaggerated to effectively describe technical details. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Exemplary embodiments of the inventive concept will now be described in conjunction with the accompanying drawings. The nonvolatile memory device according to exemplary embodiments of the inventive concept has a three-dimensional structure.

FIG. 1 is a circuit diagram illustrating a nonvolatile memory device according to an exemplary embodiment of the inventive concept.

Referring to FIG. 1, the nonvolatile memory device according to an exemplary embodiment of the inventive concept includes a cell array having a plurality of strings STR. The cell array includes a plurality of bit lines BL1 to BL3, word lines WL1 to WL4, upper selection lines USL1 to USL3, a lower selection line LSL, and a common source line CSL.

The plurality of strings STR are between the bit lines BL1 to BL3 and the common source line CSL.

Each of the strings STR includes upper and lower selection transistors UST and LST and a plurality of memory cell transistors MC connected to each other between the upper and lower selection transistors UST and LST in series. A drain of each of the upper selection transistor UST is connected to one of the bit lines BL1 to BL3. A source of each of the lower selection transistors LST is connected to the common source line CSL. The common source line CSL is a line to which all of the sources of the lower selection transistors LST are connected in common.

Further, a gate of each of the upper selection transistors UST is connected to one of the upper selection lines USL1 to USL3. A gate of each of the lower selection transistors LST is connected to the lower selection line LSL. In addition, each of the plurality of memory cell transistors MC of each of the strings STR is connected to one of the word lines WL1 to WL4.

Since the above-described cell array is arranged in the three-dimensional structure, the strings STR have a structure in which the memory cell transistors MC are connected to each other in series in a z-axis direction perpendicular to an x-y plane parallel to the upper surface of a substrate. Accordingly, channels of the selection transistors UST and LST and channels of the plurality of memory cell transistors MC may be formed perpendicular to the x-y plane.

In the nonvolatile memory device with the three-dimensional structure, m memory cells may be formed in each x-y plane, and the x-y plane having the m memory cells may be stacked in n layers (where, m and n are natural numbers, respectively).

A method of fabricating the nonvolatile memory device according to an exemplary embodiment of the inventive concept, is described with reference to FIGS. 2 to 8.

FIGS. 2 to 8 are diagrams illustrating sequentially the method of fabricating the nonvolatile memory device according to an exemplary embodiment of the inventive concept.

Figure 2:
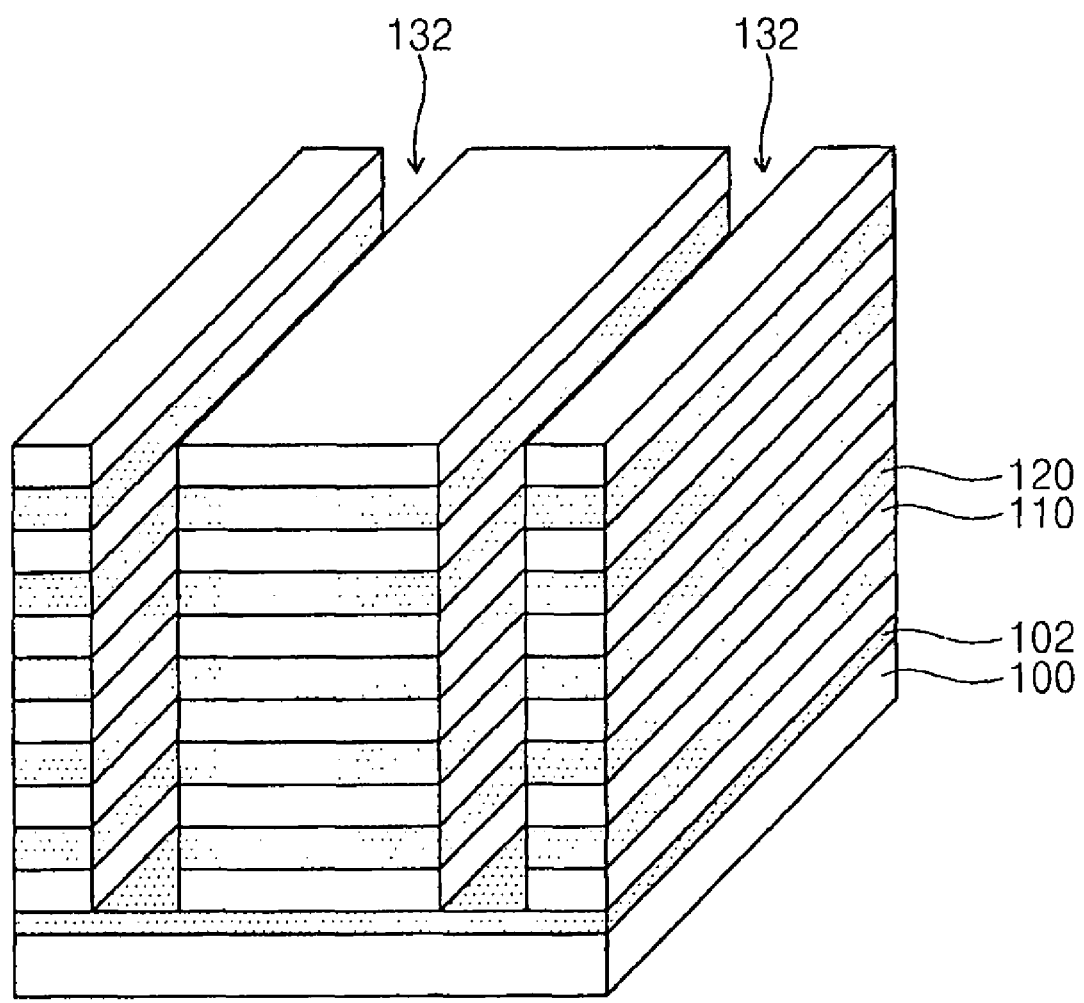
FIGS. 2 to 8 are diagrams illustrating sequentially the nonvolatile memory device according to an exemplary embodiment of the inventive concept.

Referring to FIG. 2, first and second material layers 110 and 120 are alternately stacked in two or more layers on a semiconductor substrate 100. The semiconductor substrate 100 may include an impurity region (or well) 102. The first and second material layers 110 and 120 may be alternately stacked on the impurity region 102. The number of stacked first and second material layers 110 and 120 may vary as a memory capacity varies.

The first and second material layers 110 and 120 may be formed of insulating materials that have the same main component but are different in etch rate during an isotropic etching and an anisotropic etching. Specifically, the first material layer 110 and the second material layer 120 may be formed of materials that have the same main component but have different impurity contents from each other. The first material layer 110 and the second material layer 120 may contain various elements having different etch rates. When the total elements of the first material layer 110 which are common to those of the second material layer 120 are 50% or more of the total elements of the first material layer 110 and the second material layer 120, the elements existing in the first and second material layers 110 and 120 in common are referred to as a main component. For instance, Undoped Silicate Glass (USG) and Boron Phosphorus Silicate Glass (BPSG) contain silicon elements and oxygen elements that are chemically combined with each other, and the total number of silicon and oxygen elements is 90% or more in both the USG and the BPSG. Accordingly, the silicon elements and oxygen elements are understood to be a main component.

As described above, since the first and second material layers 110 and 120 are formed of materials that have the same main component but have different impurity contents, the etch selectivity of the first and second material layers 110 and 120 may be different during etching processes having different characteristics. That is, the etch selectivity between the first and second material layers 110 and 120 during the isotropic etching process may be greater than the etch selectivity between the first and second material layers 110 and 120 during the anisotropic etching process. Further, the etch rate of the first material layer 110 may be smaller than that of the second material layer 120 during the isotropic etching process.

For example, the first and second material layers 110 and 120 are made having silicon oxide as a main component, but the impurity content of the first material layer 110 is smaller than that of the second material layer 120. For instance, the first material layer 110 may be formed of an impurity-undoped silicon oxide, while the second material layer 120 may be formed of an impurity-doped silicon oxide. More specifically, the first material layer 110 may be formed, for example, of a thermal oxide, Tetra Ethyl Ortho Silicate (TEOS), Undoped Silicate Glass (USG), Plasma Enhanced Tetra Ethyl Ortho Silicate (PE-TEOS), or High Density Plasma (HDP) oxide. For instance, the second material layer 120 may be formed of an oxide doped with impurities such as boron and/or phosphorous, that is, BoroSilicate Glass (BSG), PhosphoSilicate Glass (PSG), or BoroPhosphoSilicate Glass (BPSG).

As another exemplary embodiment, the first and second material layers 110 and 120, which are formed of materials that have the same main component but have different impurity contents, respectively, are, for example, a low dielectric layer (for example, SiOC or SiOF) doped with impurities such as fluorine or carbon.

Alternatively, when the first material layer 110 is formed of a silicon oxide undoped with impurities, and when the second material layer 120 is formed of a silicon oxide doped with impurities, the first and second material layers 110 and 120 may be formed in-situ over and over again. That is, the first and second material layers 110 and 120 may alternatively be formed by controlling the supply of impurities in forming the silicon oxide. When the first and second material layers 110 and 120 are alternately stacked in two or more layers, process efficiency is improved.

A plurality of first trenches 132 are formed on the first and second material layers 110 and 120 in the form of a line. The first trenches 132 are in the form of a line extending in a first direction to expose the semiconductor substrate 100. The first trenches 132 are spaced apart from each other at a predetermined distance in parallel with each other. Sidewalls of the first and second material layers 110 and 120 may be exposed by the first trenches 132. More specifically, the first trenches 132 may be formed by forming mask patterns (not shown) on the first and second stacked material layers 110 and 120 and anisotropically etching the first and second material layers 110 and 120. The anisotropic etching of the first and second material layers 110 and 120 is performed, for example, by using a CFx-based etching gas. Since the first and second material layers 110 and 120 have a low etch selectivity during an anisotropic etching process, the first trenches 132 are formed having a uniform inner wall through the anisotropic etching process. That is, the sidewalls of the first and second material layers 110 and 120, which are exposed by the first trenches 132, form a plane vertical to the semiconductor substrate 100.

Figure 3:
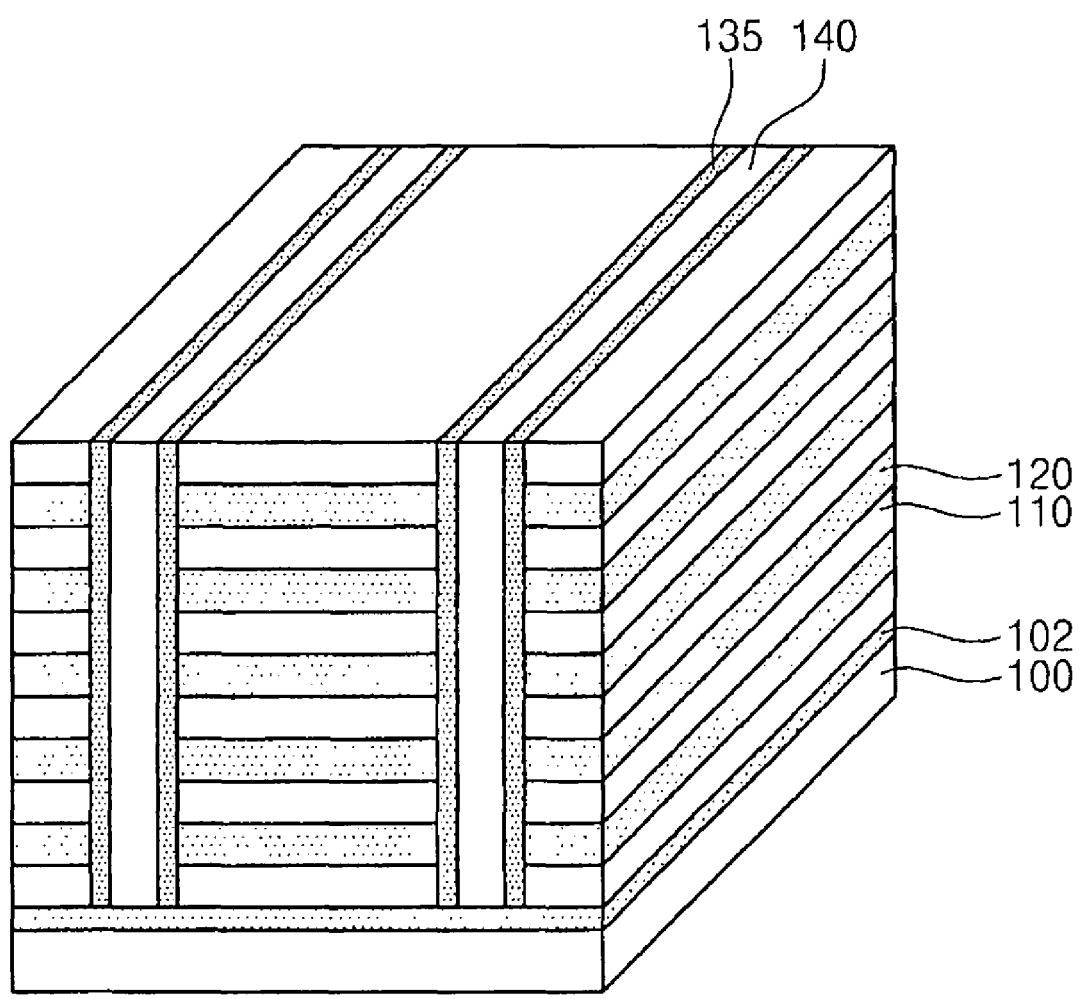

Referring to FIG. 3, semiconductor patterns 135 are formed on a first sidewall of the first and second material layers 110 and 120 exposed by the first trenches 132. Specifically, a semiconductor layer is conformally stacked along the sidewalls of the first and second material layers 110 and 120 exposed by the first trenches 132, and then the semiconductor patterns 135 are formed, for example, by anisotropically etching the semiconductor layer. That is, the semiconductor patterns 135 cover the sidewalls of the first and second material layers 110 and 120. The semiconductor patterns 135 are made, for example, of a poly crystalline semiconductor and are formed by a chemical vapor deposition. Alternatively, the semiconductor patterns 135, which are made of a single crystalline semiconductor, are formed in the first trenches 132 by an epitaxial process using the semiconductor substrate 100 exposed by the first trenches 132 as a seed layer.

After forming the semiconductor patterns 135, insulating layers 140 are formed between the semiconductor patterns 135 by burying an insulating material in the first trenches 132 and then planarizing the buried insulating material.

Figure 4:
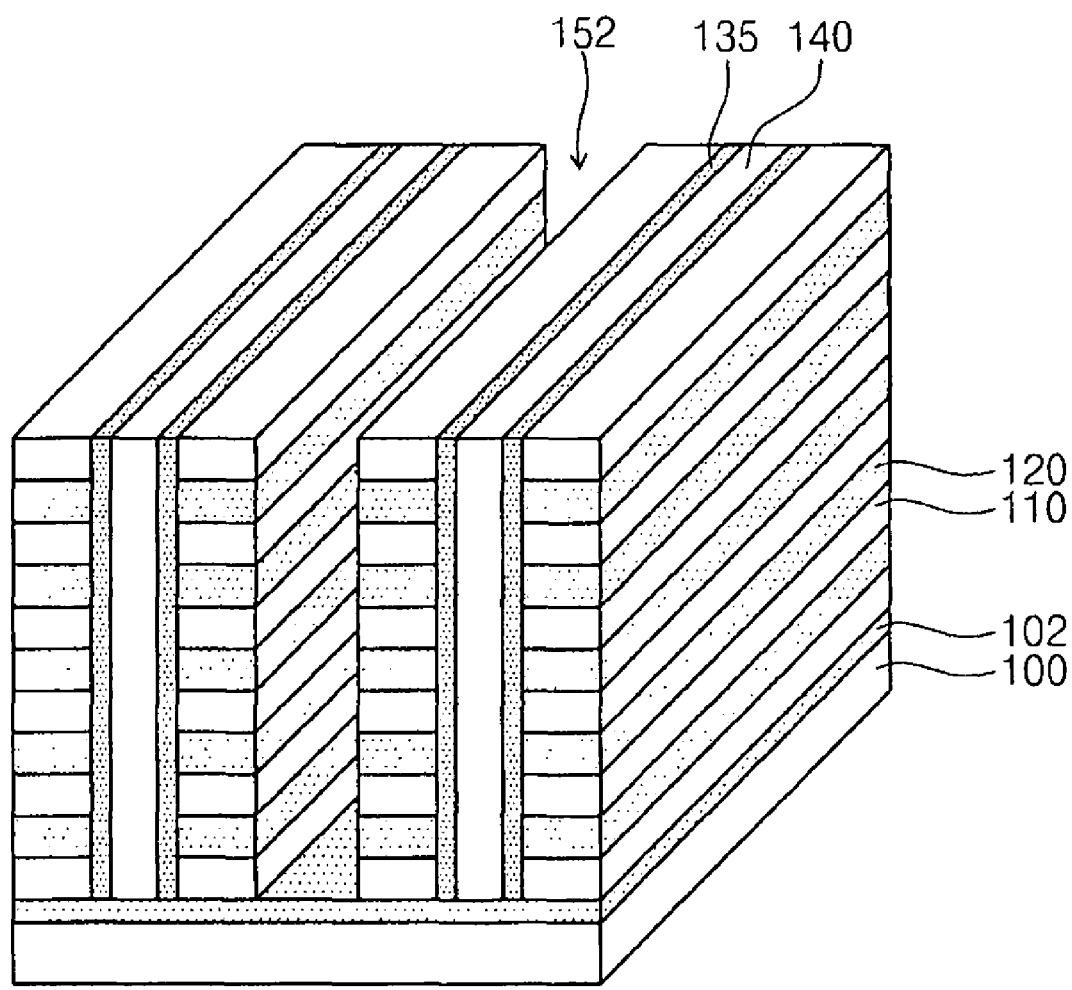

Referring to FIG. 4, second trenches 152 are formed between the first trenches 132 in which the semiconductor patterns 135 are formed. The second trenches 152 may be formed by performing a photolithography and an anisotropic etching with respect to the first and second material layers 110 and 120 that are stacked. The second trenches 152 may be formed in the form of a line. Moreover, the second trenches 152 may be in parallel with the first trenches 132. Since the first and second material layers 110 and 120 may be formed of materials having a low etch selectivity during an anisotropic etching process, sidewalls of the second trenches 152 formed by the anisotropic etching process also have a uniform profile. In addition, as the first and second trenches 132 and 152 are formed, the first and second material layers 110 and 120 on the semiconductor substrate 100 may be patterned in the form of a line.

Figure 5:
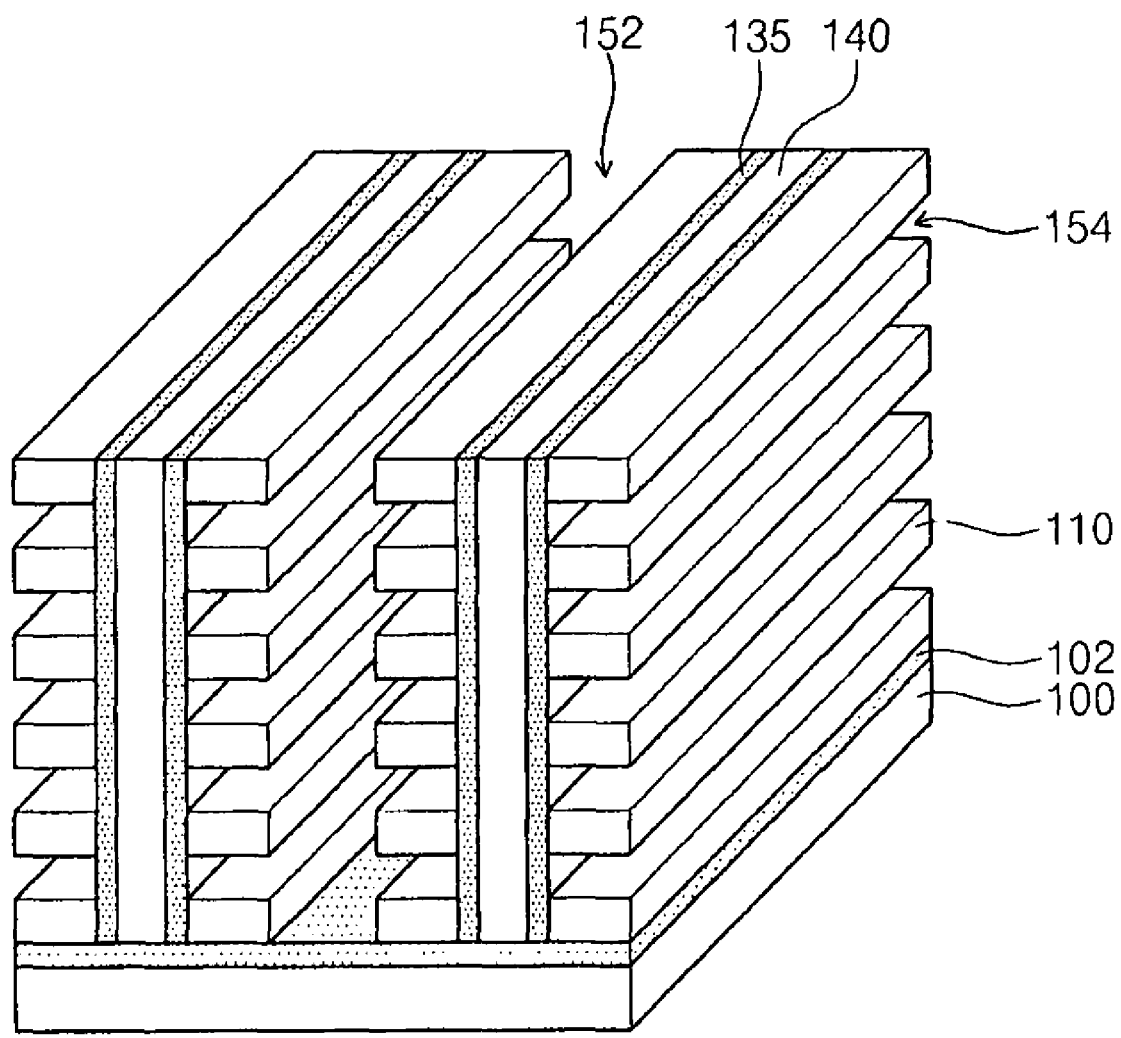

Referring to FIG. 5, portions of the sidewalls of the semiconductor patterns 135 are exposed in the second trenches 152 by removing the second material layers 120 formed between the first material layers 110. That is, an empty space 154 may be formed between the first material layers 110 that are stacked. Specifically, the first and second material layers 110 and 120 may have a greater etch selectivity during the isotropic etching process due to the difference in impurity content of the first and second material layers, respectively. Furthermore, when the first and second material layers 110 and 120 are a silicon oxide layer containing impurities, the etch rate may be greater in a specific etchant as compared to a silicon oxide layer undoped with impurities. That is, when the etchant is supplied into the second trenches 152, the second material layers 120 may selectively be etched. At this time, since the first material layer 110 and the second material layer 120 are formed of materials that are greatly different in etch rate during the isotropic etching process, it is possible to selectively remove the second material layers 120 while reducing the damage of the first material layers 110 during the isotropic etching process.

More specifically, when the second material layers 120 are a silicon oxide layer doped with impurities, the second material layers 120 may be etched selectively by using HF gas. As another example, the second material layers 120 may selectively be removed by using mixtures of hydrofluoric acid (HF) and de-ionized water ($H_2O$). As another example, the second material layers 120 may be removed by using mixtures of low-polar organic solvents, hydrofluoric acid (HF), and de-ionized water ($H_2O$). The low-polar organic solvents may be, for example, carbonyl, carboxylic acid, ether, ester, and alcohol having a dielectric constant of 30 dyn/$cm^2$ or less. In this case, the second material layers 120 may be removed by the isotropic etching process using mixtures of the low-polar organic solvents having a mass ratio of about 10~99.9%, hydrofluoric acid having a mass ratio of about 0.01~10%, and de-ionized water having a mass ratio of about 0.1~80% under the condition of about 90~110° C. Since the first material layers 110 are formed of materials in which the etch rate is low with respect to the mixtures, the second material layers 120 may be removed selectively, while maintaining the first material layers 110 on the semiconductor substrate 100.

The isotropic etching process may remove the second material layers 120 in a spin manner of single type or in a dipping manner of single type or batch type.

When the second material layers 120 make use of a nitride layer having a great difference in the isotropic etch selectivity as compared to the first material layers 110 (for example, oxide layer), phosphoric acid ($H_3PO_4$) solution may be used in order to remove the second material layers 120. The phosphoric acid ($H_3PO_4$) solution may impair the portions of the semiconductor patterns 135 to be exposed by the removal of the second material layers 120.

Alternatively, when the second material layers 120 are formed of a silicon oxide doped with impurities having the difference in the isotropic etch selectivity during the isotropic etching process as compared to the first material layers 110, the second material layers 120 may be removed without using the phosphoric acid solution. Therefore, the semiconductor patterns 135, which are made of single crystalline semiconductor materials or poly crystalline semiconductor materials, are not impaired by the phosphoric acid solution. Since the semiconductor patterns 135 serving as a channel of the nonvolatile memory device are not impaired, electrical characteristics of the nonvolatile memory device are improved.

Figure 6:
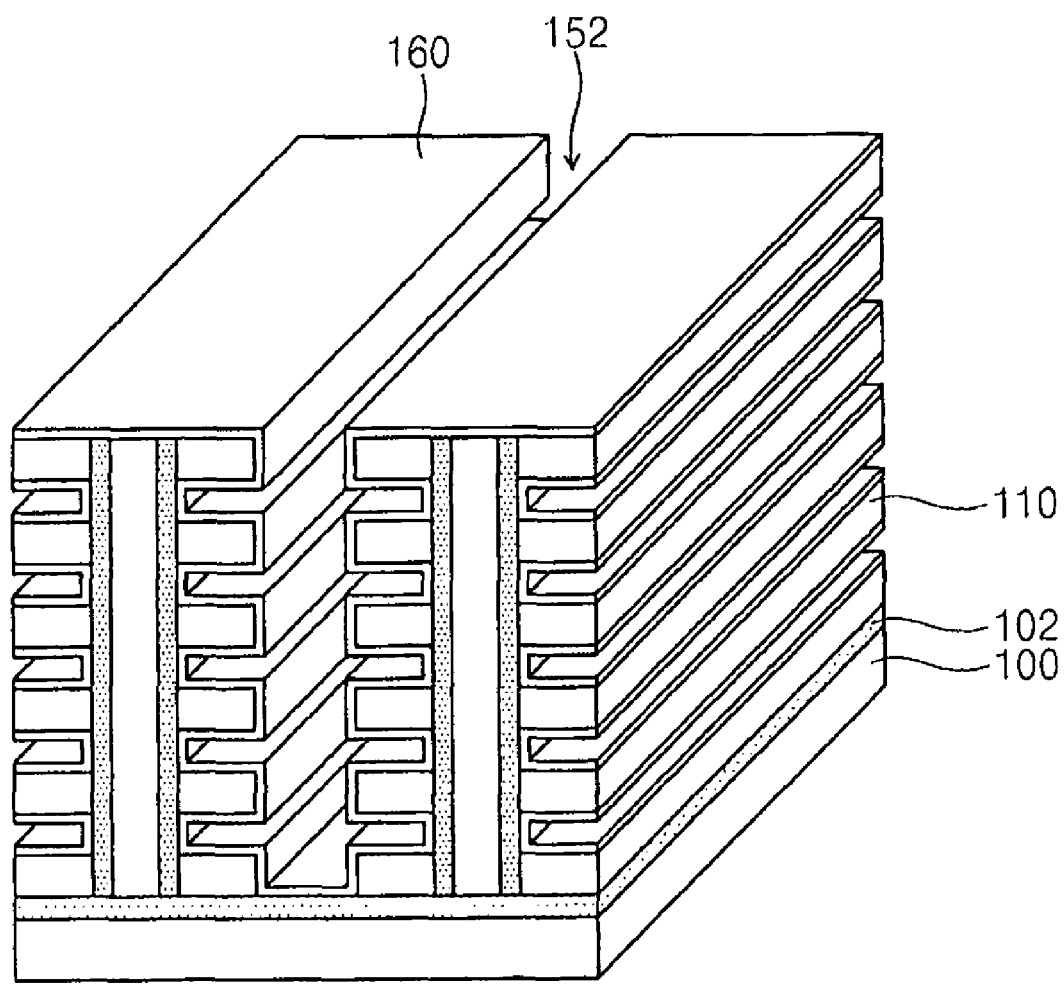

Referring to FIG. 6, a charge storage layer 160 is conformally formed along the second trenches 152 exposing portions of the sidewalls of the semiconductor patterns 135. That is, the charge storage layer 160 may cover portions of the sidewalls of the semiconductor patterns 135 and surfaces of the first material layers 110. In addition, the charge storage layer 160 may be formed by depositing a charge blocking layer, a charge trapping layer, and a charge tunneling layer in this order.

Figure 7:
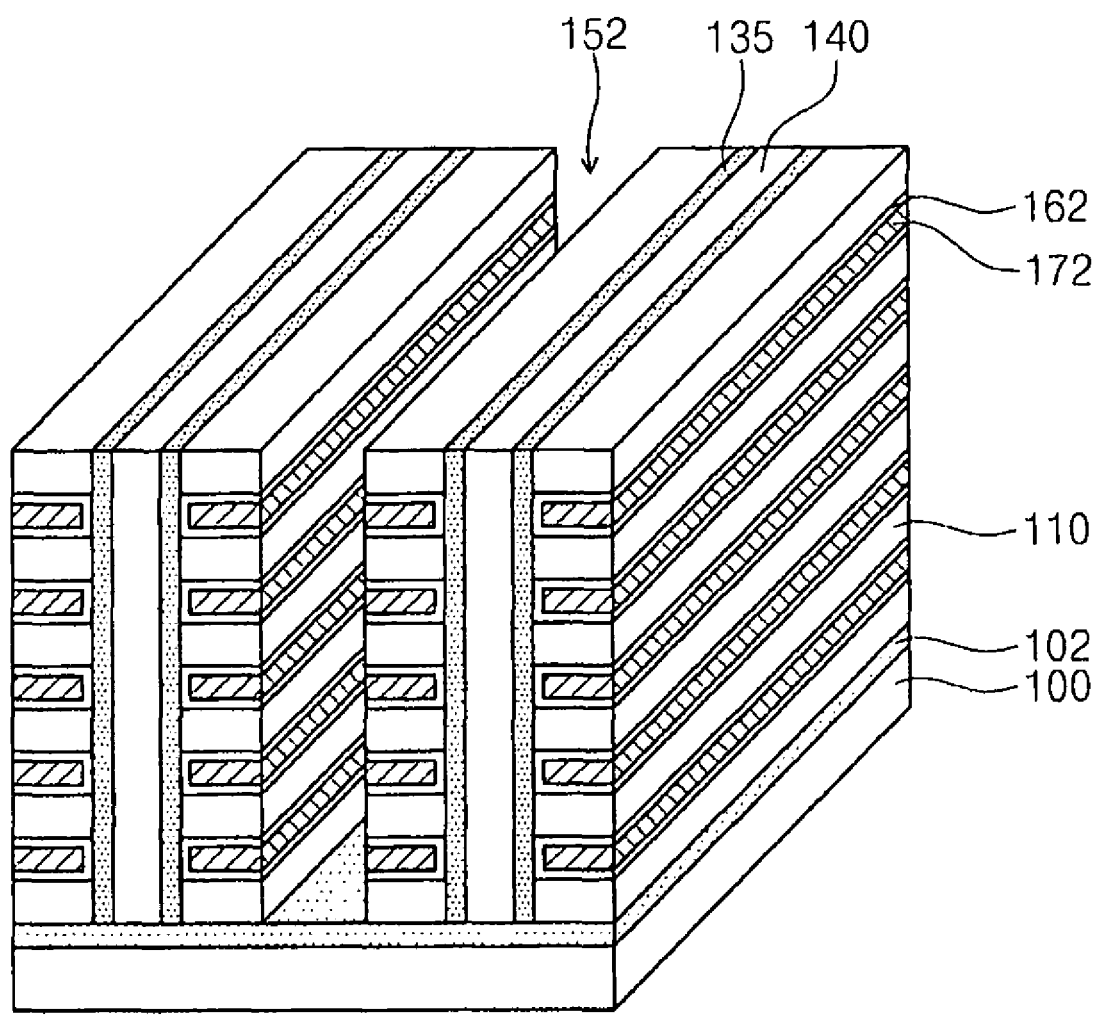

Referring to FIG. 7, a conductive layer is buried in the second trenches 152. The conductive layer may be formed by depositing a conductive material. During the deposition, the conductive material is filled between the first material layers vertically adjacent to each other. A poly silicon layer or a metal layer may be used as the conductive material.

Subsequently, by patterning the conductive layer buried in the second trenches 152, the conductive layer is separated into line-type gate electrodes. That is, the gate electrodes 172 may be formed between the first material layers 110 vertically adjacent to each other by removing the conductive layer buried in the first material layers 110 horizontally adjacent to each other. That is, the second trenches 152 exposing the semiconductor substrate 100 are re-formed by anisotropically etching the conductive layer. As a result, a structure in which the first material layers 110 and the gate electrodes 172 are alternately stacked is formed on the semiconductor substrate 100, and the gate electrodes 172 are three-dimensionally disposed on the semiconductor substrate 100.

When the conductive layer is separated into the gate electrodes 172, the sidewalls of the first material layers 110 may be exposed in the second trenches 152 to be re-formed. That is, the charge storage layer 160 formed at the sidewall of the first material layer 110 may be removed. Accordingly, charge-storage-layer patterns 162 may locally be formed between the first material layers 110.

Figure 8:
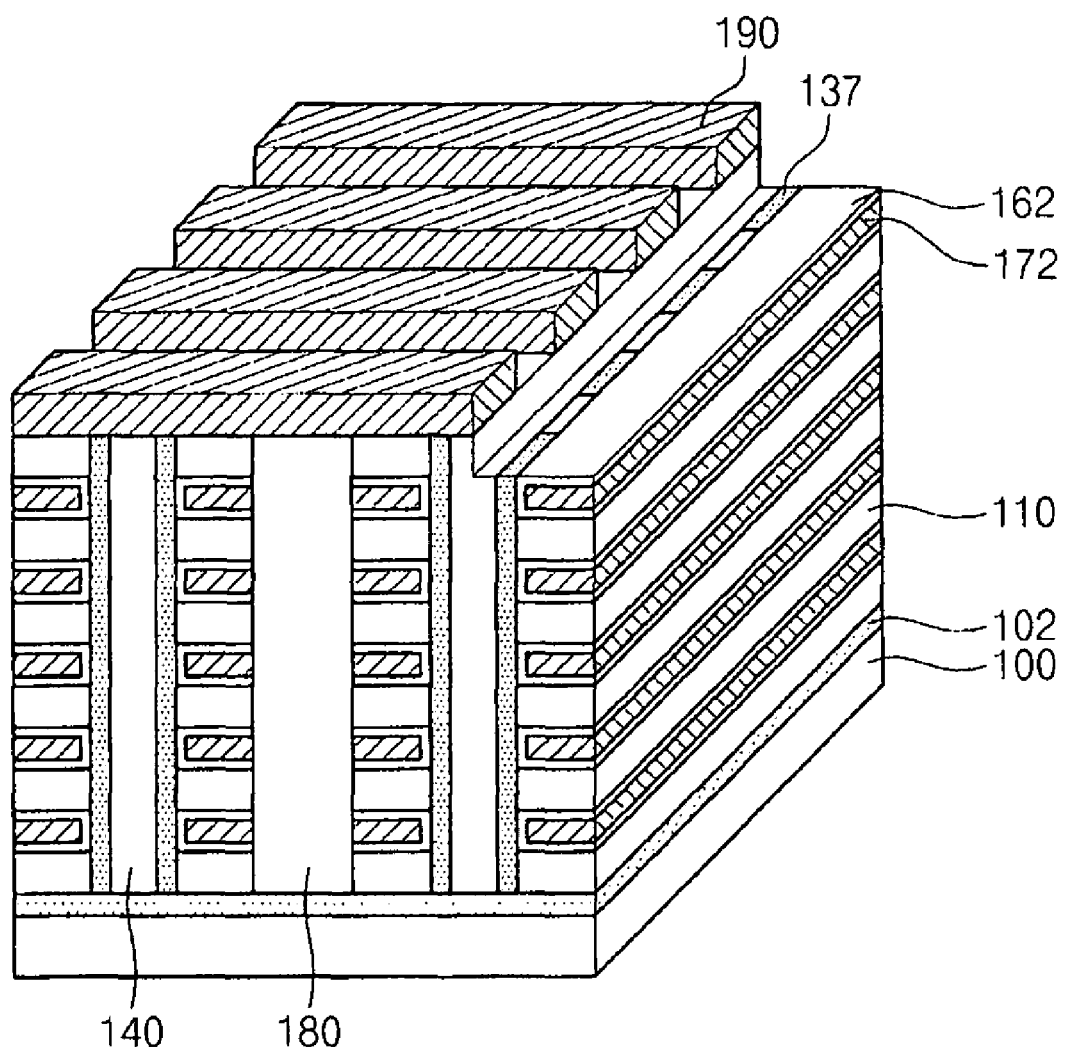

Referring to FIG. 8, an insulating layer 180 is buried in the re-formed second trench 152, and an upper face of the insulating layer 180 is then planarized. Subsequently, channel semiconductor patterns 137 may be formed by patterning the semiconductor pattern 135, which is formed at the sidewall of the first material layers 110, in the form of a line. The process for patterning the semiconductor patterns in the form of a line may be performed before the formation of the second trenches 152, as illustrated in FIG. 4. As a result, the line-type channel semiconductor patterns 137 may be formed so as to intersect one sidewall of the stacked gate electrodes 172 and be spaced apart from each other. In addition, bit lines 190 are formed over the stacked gate electrodes 172 so as to intersect the gate electrodes 172 and be electrically connected to the channel semiconductor patterns 137.

Figure 9:
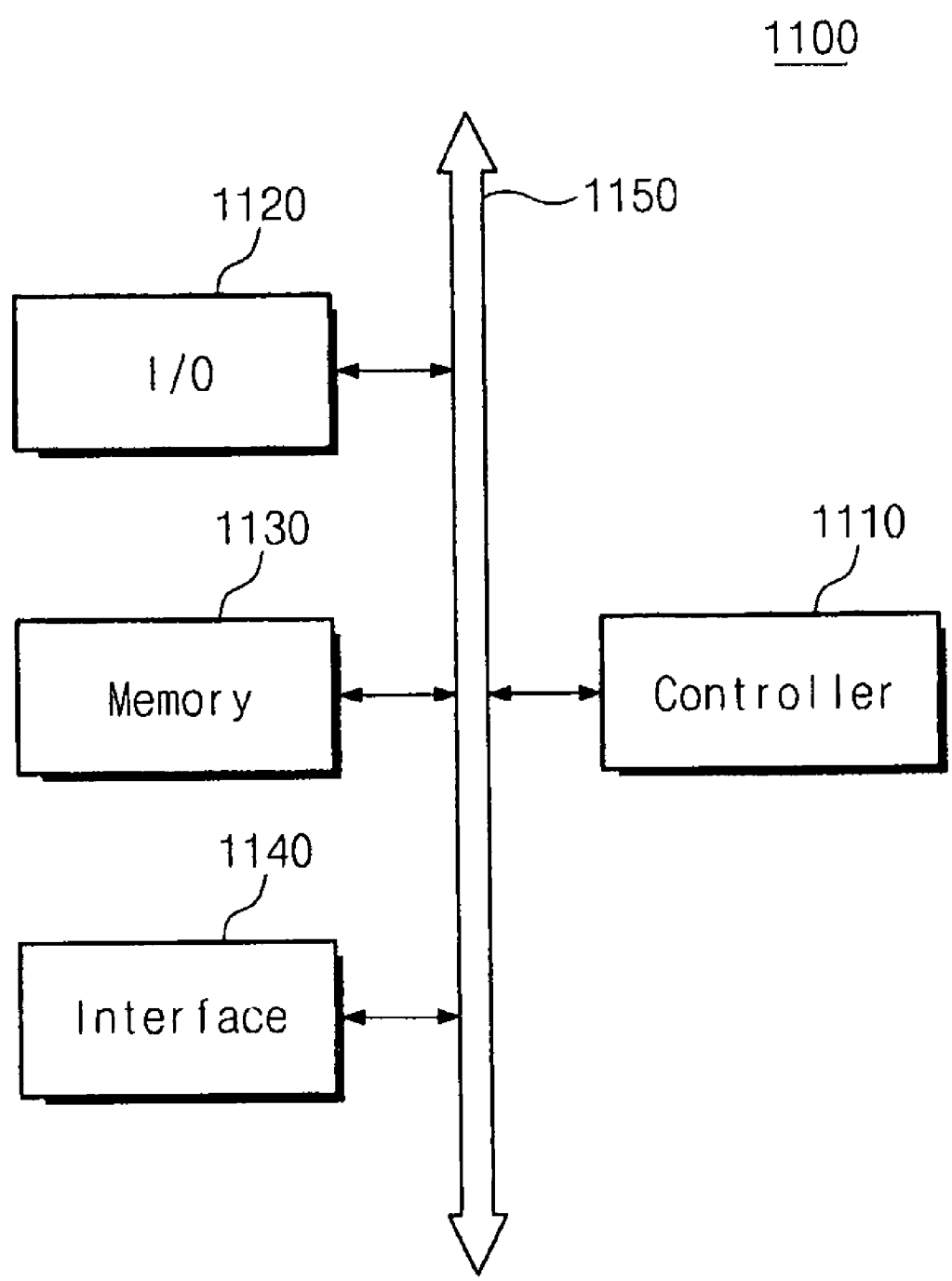
FIG. 9 is a schematic block diagram illustrating an example of a memory system including the nonvolatile memory device according to an exemplary embodiment of the inventive concept.

FIG. 9 is a schematic block diagram illustrating an example of memory system including a nonvolatile memory device according to exemplary embodiments of the inventive concept.

Referring to FIG. 9, a memory system 1100 may be applicable, for example, to a PDA, portable computer, web tablet, wireless phone, mobile phone, digital music player, memory card, or all of devices capable of transmitting and/or receiving information in wireless environment.

The memory system 1100 includes a controller 1110, an input/output (I/O) device 1120 such as a keypad, keyboard, and display, a memory 1130, an interface 1140, and a bus 1150. The memory 1130 and the interface 1140 communicate with each other through the bus 1150.

The controller 1110 includes at least one microprocessor, digital signal processor, microcontroller, or others process devices similar to these. The memory 1130 may be used for storing instructions executed by the controller. The I/O device 1120 may receive data or signals from the exterior of the system 1100 or may output data or signals to the exterior of the system 1100. For example, the I/O device 1120 may include a keypad, a keyboard, and a display device.

The memory 1130 includes the nonvolatile memory device according to the exemplary embodiments of the inventive concept. The memory 1130 may further include other types of memory, for example, a volatile memory capable of arbitrarily accessing data whenever necessary, and various types of memories.

The interface 1140 transmits data to a communication network or receives data from a communication network.

Figure 10:
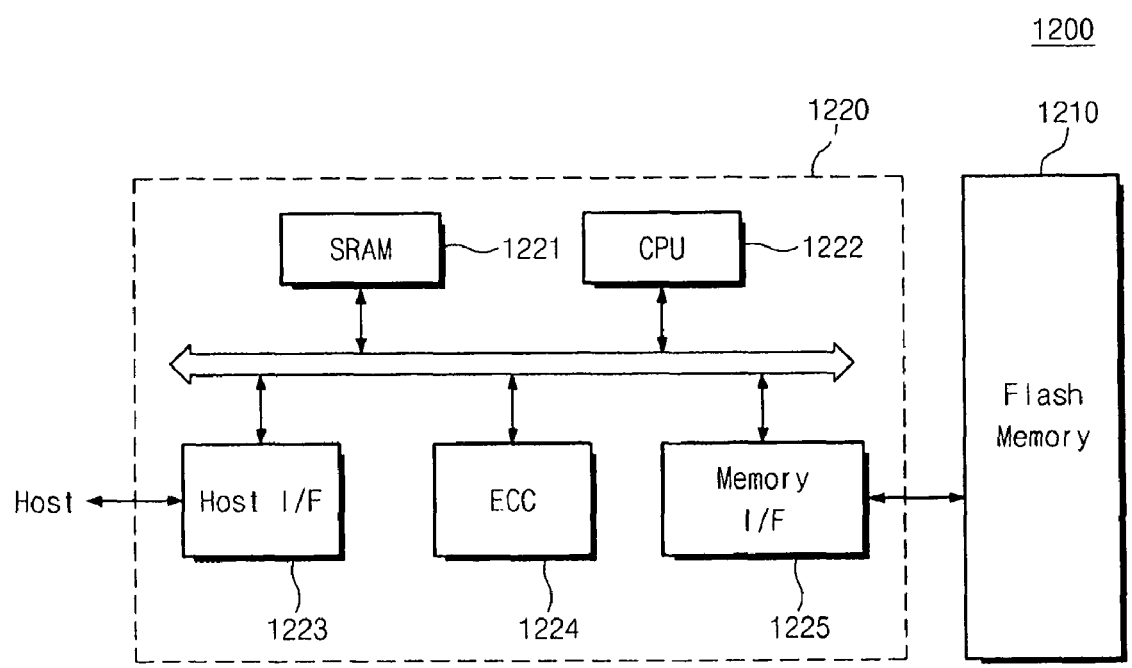
FIG. 10 is a schematic block diagram illustrating an example of a memory system including the nonvolatile memory device according to an exemplary embodiment of the inventive concept.

FIG. 10 is a schematic block diagram illustrating an example of memory card including a nonvolatile memory device according to exemplary embodiments of the inventive concept.

Referring to FIG. 10, a memory card 1200 is provided with a flash memory device 1210 according to the exemplary embodiments of the inventive concept to support a mass data storing capability. The memory card 1200 may include a memory controller 1220 for controlling all the data exchanges between a host and the flash memory device 1210.

An SRAM 1221 is used as an operation memory of a CPU (Central Processing Unit) 1222. A host interface 1223 may be provided with a data exchange protocol between the memory card 1200 and the host. An ECC (Error Correction Code) 1224 may detect and correct errors of data read from the flash memory device 1210. A memory interface 1225 interfaces with the flash memory device 1210. The CPU 1222 controls overall operations for the data exchange of the memory controller 1220. Even though not illustrated in FIG. 10, it will be apparent to those skilled in the art that the memory card 1200 may further include a ROM (not shown) that stores code data for interfacing with the host.

According to the exemplary embodiments of the inventive concept, the flash memory device and the memory card or the memory system may provide a memory system having a high reliability through the flash memory device 1210 in which an erasing characteristic of dummy cells is improved. Especially, the flash memory device according to the exemplary embodiments of the inventive concept may be provided in a memory system such as a semiconductor disk device (SSD: Solid State Disk). In this case, the memory system is embodied having a high reliability by preventing a reading error caused by the dummy cells.

Figure 11:
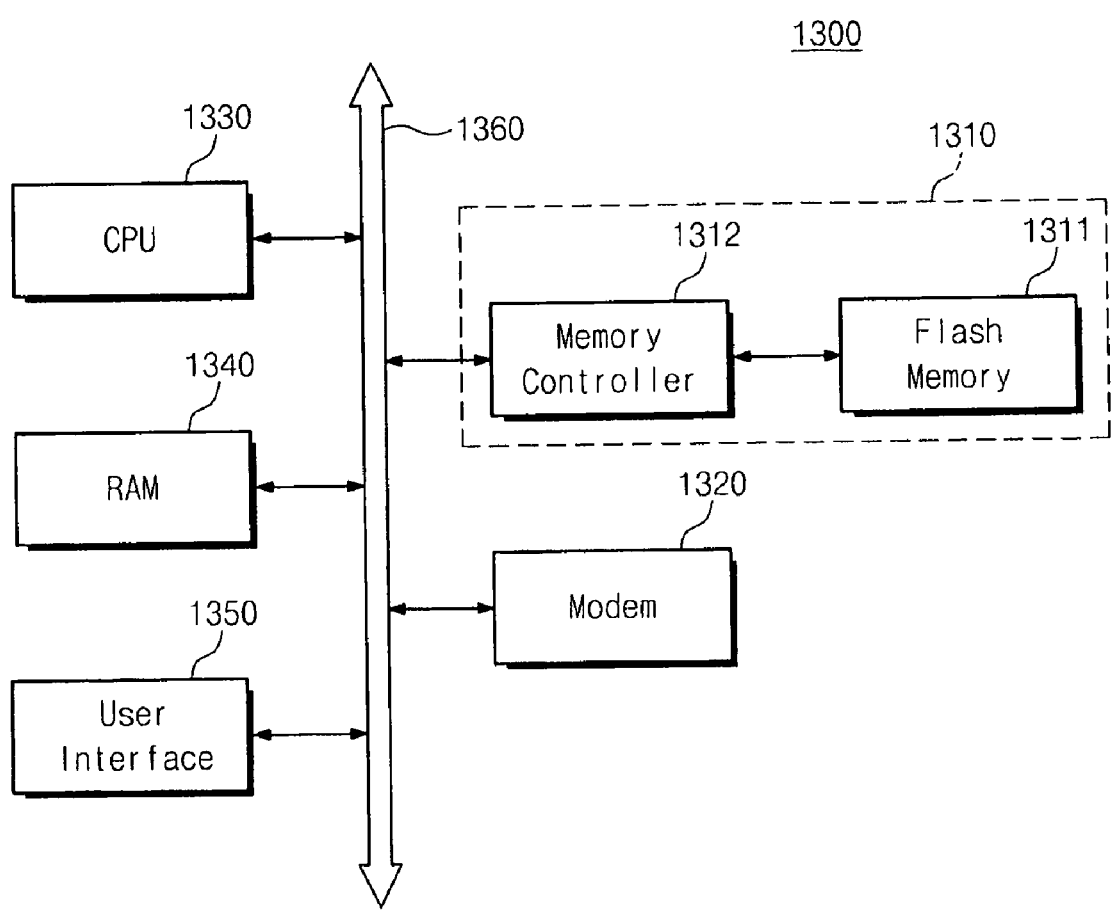
FIG. 11 is a schematic block diagram illustrating an example of an information processing system including the nonvolatile memory device according to an exemplary embodiment of the inventive concept.

FIG. 11 is a schematic block diagram illustrating an example of an information processing system including a nonvolatile memory device according to exemplary embodiments of the inventive concept.

Referring to FIG. 11, a flash memory system 1310 is mounted to an information processing system such as a mobile product or a desk top computer. An information processing system 1300 includes a flash memory system 1310, a modem 1320, a central processing unit 1330, a RAM 1340 and a user interface 1350, which are electrically connected to a system bus 1360, respectively. The flash memory system 1310 may have substantially the same configuration as the above-described memory system or flash memory system. Data, which is processed by the CPU 1330 or input from the exterior, is stored in the flash memory system 1310. The flash memory system 1310 may be composed of, for example, a semiconductor disk device (SSD). In this case, the information processing system 1300 can stably store the mass data in the flash memory system 1310. Moreover, as the reliability increases, the flash memory system 1310 may reduce resources required for an error correction, thereby providing a high-speed data exchange function to the information processing system 1300. Although not illustrated in FIG. 11, it will be apparent to those skilled in the art that an application chipset, a Camera Image Processor (CIS), an input/output device and other such devices may further be provided to the information processing system 1300 according to the exemplary embodiments of the inventive concept.

The flash memory system or the memory system according to the exemplary embodiments of the inventive concept may be mounted by various types of packages. For example, the flash memory system or the memory system may be packaged and mounted in such manners as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

According to the method of fabricating the nonvolatile memory device of the inventive concept, the three-dimensional nonvolatile memory device is fabricated by using a first material layer and a second material layer formed of materials that have the same main component but have different impurity contents from each other, thereby uniformly forming a sidewall profile of a stack structure that is alternately stacked with the first and second material layers. In addition, metal patterns are formed by selectively removing the second material layers while preventing the first material layers from being impaired.

Furthermore, since the main component of the first material layer is equal to that of the second material layer, the first and second material layers may be alternately stacked in an in-situ manner while adjusting impurities. This improves the fabricating efficiency.

In addition, when the first and second material layers are formed of a silicon oxide as a main component, the channel semiconductor of the nonvolatile memory device is prevented from being impaired during the removal of the second material layers.

Although the inventive concept has been described in connection with the embodiment of the inventive concept illustrated in the accompanying drawings, it is not limited thereto. It will be apparent to those skilled in the art that various substitution, modifications and changes may be thereto without departing from the scope and spirit of the inventive concept.

What is claimed is:

1. A method of fabricating a nonvolatile memory device, the method comprising:
   alternately stacking first and second material layers in two or more layers on a semiconductor substrate;
   forming trenches on the semiconductor substrate, penetrating the stacked first and second material layers and exposing sidewalls of the first and second material layers by performing a first etching process;
   after performing the first etching process, removing the second material layers exposed in the trenches by performing a second etching process;
   wherein the first and second material layers are formed of materials that have the same main component and have different impurity contents, respectively;
   wherein the forming of the trenches includes forming first trenches and forming a second trench after forming the first trenches;
   wherein the method further includes forming a semiconductor pattern at an inner wall of the first trenches after forming the first trenches;
   wherein the removing of the second material layers includes removing the second material layers exposed by the second trench and exposing portions of sidewalls of the semiconductor pattern; and
   wherein the method further includes forming a charge storage layer and a conductive pattern on the exposed semiconductor pattern.

2. The method as set forth in claim 1, wherein an etch selectivity of the first and second material layers during the second etching process is greater than that of the first and second material layers during the first etching process.

3. The method as set forth in claim 2, wherein an etch rate of the second material layer is greater than that of the first material layer during the second etching process.

4. The method as set forth in claim 1, wherein the first and second material layers are stacked in-situ.

5. The method as set forth in claim 1, wherein the first and second material layers are formed of a silicon oxide, and
   the impurity content of the second material layer is greater than that of the first material layer.

6. The method as set forth in claim 5, wherein the first material layer is formed of a thermal oxide, TEOS (Tetra Ethyl Ortho Silicate), HDP (High Density Plasma), or USG (Undoped Silicate Glass), and
   the second material layer is formed of BPSG (BoroPhosphoSilicate Glass), BSG (BoroSilicate Glass), or PSG (PhosphoSilicate Glass).

7. The method as set forth in claim 6, wherein the second etching process removes the second material layer by using HF gas, mixtures of hydrofluoric acid and de-ionized water, or mixtures of low-polar organic solvent, hydrofluoric acid, and de-ionized water.

8. The method as set forth in claim 1, wherein the first etching process is an anisotropic etching process, and the second etching process is an isotropic etching process.

9. A method of fabricating a nonvolatile memory device, the method comprising:
    forming a thin layer structure by alternately stacking first and second material layers on a semiconductor substrate;
    forming first trenches on the semiconductor substrate, penetrating the thin layer structure and exposing the semiconductor substrate by performing a first etching process;
    forming a semiconductor pattern at an inner wall of the first trenches after forming the first trenches, extending from the semiconductor substrate in the first trenches to be connected to the semiconductor substrate;
    forming a second trench on the semiconductor substrate after forming the first trenches, penetrating the thin layer structure and exposing the semiconductor substrate spaced apart from the semiconductor pattern by performing the first etching process;
    removing the second material layers exposed in the second trench by performing a second etching process to form recess regions exposing portions of sidewalls of the semiconductor patterns;
    wherein the first and second material layers are formed of insulation materials that have the same main component and have different impurity contents, respectively; and
    forming charge storage layers and conductive patterns on the exposed semiconductor pattern in the recess regions.

10. A method of fabricating a nonvolatile memory device, the method comprising:
    alternately stacking first and second material layers in two or more layers on a semiconductor substrate;
    forming trenches on the semiconductor substrate, penetrating the stacked first and second material layers by performing a first etching process;
    removing the second material layers exposed in the trenches by performing a second etching process;
    wherein the first and second material layers are formed of insulation materials that have the same main component and have different impurity contents, respectively;
    wherein the forming of the trenches on the semiconductor substrate includes forming a first trenches and forming a second trench after forming the first trenches;
    wherein the method further includes forming a semiconductor pattern at an inner wall of the first trenches after forming the first trenches;
    wherein the removing of the second material layers includes removing the second material layers exposed by the second trench and exposing portions of sidewalls of the semiconductor pattern; and
    wherein the method further includes forming a charge storage layer and a conductive pattern on the exposed semiconductor pattern.

11. A method of fabricating a nonvolatile memory device, the method comprising:
    alternately stacking first and second material layers in two or more layers on a semiconductor substrate;
    forming first trenches on the semiconductor substrate;
    forming semiconductor patterns, penetrating the stacked first and second material layers to be connected to the semiconductor substrate at an inner wall of the first trenches after forming the first trenches on the semiconductor substrate;
    forming second trenches on the semiconductor substrate, after forming the first trenches, penetrating the stacked first and second material layers between the semiconductor patterns by performing a first etching process;
    removing the second material layers exposed in the second trenches and exposing portions of sidewalls of the semiconductor pattern by performing a second etching process;
    wherein the first and second material layers are formed of materials that have the same main component and have different impurity contents, respectively; and
    forming a charge storage layer and a conductive pattern on the exposed semiconductor pattern.

* * * * *